United States Patent
Weed

(10) Patent No.: US 6,658,640 B2
(45) Date of Patent: Dec. 2, 2003

(54) SIMULATION-BASED FEED FORWARD PROCESS CONTROL

(75) Inventor: J. Tracy Weed, San Jose, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 47 days.

(21) Appl. No.: 10/033,511

(22) Filed: Dec. 26, 2001

(65) Prior Publication Data

US 2003/0119216 A1 Jun. 26, 2003

(51) Int. Cl.⁷ ............................................. G06F 17/50

(52) U.S. Cl. ....................................................... 716/19

(58) Field of Search ....................... 235/462.08; 716/19, 716/8, 2; 250/234; 438/14

(56) References Cited

U.S. PATENT DOCUMENTS

| | | | |
|---|---|---|---|
| 5,282,140 A | 1/1994 | Tazawa et al. | 364/468 |
| 5,326,659 A | 7/1994 | Liu et al. | 430/5 |
| 6,016,357 A | 1/2000 | Neary et al. | 382/144 |
| 6,049,789 A | 4/2000 | Frison et al. | 705/59 |
| 6,078,738 A | 6/2000 | Garza et al. | 395/500.22 |
| 6,091,845 A | 7/2000 | Pierrat et al. | 382/144 |
| 6,171,731 B1 | 1/2001 | Medvedeva et al. | 430/5 |
| 6,225,025 B1 | 5/2001 | Hoshino | 430/296 |
| 6,272,236 B1 | 8/2001 | Pierrat et al. | 382/144 |
| 6,339,836 B1 | 1/2002 | Eisenhofer et al. | 716/5 |
| 6,370,679 B1 * | 4/2002 | Chang | |
| 6,523,748 B1 * | 2/2003 | Nishikata | 235/462.08 |
| 6,578,188 B1 * | 6/2003 | Pang | |
| 2002/0019729 A1 | 2/2002 | Chang et al. | 703/6 |
| 2002/0035461 A1 | 3/2002 | Chang et al. | 703/13 |

FOREIGN PATENT DOCUMENTS

WO    WO 99/14706 A2    3/1999

OTHER PUBLICATIONS

Cobb, N., "Fast Optical and Process Proximity Correction Algorithms for Integrated Circuit Manufacturing", Dissertation, University of California at Berkeley, UMI Microform 9902038 (139 pages).

Uhring, W., et al., "Model of an Instrumented Opto–Electronic Transmission System in HDL–A and VHDL–AMS", SPIE, vol. 3893, pp. 137–146, Oct. 1999.

Granik, Y., et al., "Sub–Resolution Process Windows And Yield Estimation Technique Based On Detailed Full–Chip CD Simulation", SPIE, vol. 4182, pp. 335–341 (2000).

Stirniman, J., et al., "Spatial Filter Models to Describe IC Lithographic Behavior", Precim Corporation, Portland, Oregon (10 pages).

Cobb, et al., "Fast Sparse Aerial Image Calculation for OPC", SPIE, vol. 2621, pp. 534–544, Sep. 20–22, 1995.

Kang, D., et al., "Effects of Mask Bias on t he Mask Error Enhancement Factor (MEEF) of Contact Holes" (11 pages).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

(List continued on next page.)

Primary Examiner—John F. Niebling
Assistant Examiner—Andre C Stevenson
(74) Attorney, Agent, or Firm—Bever, Hoffman & Harms, LLP; Jeanette S. Harms

(57) ABSTRACT

A method of optimizing a wafer fabrication process for a given mask is provided. The method includes capturing an image of a mask and simulating a wafer image of the mask. A mask map of information can then be generated based on the simulated wafer image. The resulting mask map can be provided to any downstream wafer fabrication process when such process involves the mask. One or more one input parameters to the downstream wafer fabrication process can be changed based on the mask map, thereby optimizing the process for the given mask.

15 Claims, 4 Drawing Sheets

OTHER PUBLICATIONS

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Erdmann, A., "Topography Effects and Wave Aberrations in Advanced PSM–Technology", Fraunhofer Institute of Integrated Circuits (11 pages).

Neureuther, A., et al., "Modeling Defect–Feature Interactions in the Presence of Aberrations", University of California Berkeley (10 pages).

Mathur, B.P., et al., "Quantitative Evaluation of Shape of Image on Photoresist of Square Apertures", IEEE, Transactions On Electron Devices, vol. 35, No. 3, pp. 294–297, Mar. 1988.

Neureuther, A., "Modeling Phase Shifting Masks", SPIE, 10th Annual Symposium On Microlithography, vol. 1496, pp. 80–85 (1990).

Crisalle, O., et al., "A Comparison of the Optical Projection Lithography Simulators in SAMPLE and PROLITH", IEEE, Transactions On Semiconductor Manufacturing, vol. 5, No. 1, pp. 14–26, Feb. 1992.

Rieger, M., et al., "System for Lithography Proximity Compensation", Precim Company, Portland, Oregon, Sep. 1993 (28 pages).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Spence, C., et al., "Automated Determination of CAD Layout Failures Through Focus: Experiment and Simulation", SPIE, vol. 2197, pp. 302–313 (1994).

Qian, Q.D., et al., "A New Scalar Planewave Model for High NA Lithography Simulations", IEEE, pp. 45–48 (1994).

Brunner, T., et al., "Approximate Models for Resist Processing Effects", SPIE, vol. 2726, pp. 198–207, Mar. 1996.

Chang, K., et al., "Accurate Modeling of Deep Submicron Interconnect Technology", TMA Times, vol. IX, No. 3 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62–74, Feb. 1997.

Brunner, T., "Impact of Lens Aberrations on Optical Lithography", IBM J. Res. Develop., vol. 41, No. 1/2, pp. 57–67, Jan./Mar. 1997.

Tsujimoto, E., et al., "Hierarchial Mask Data Design System (PROPHET) for Aerial Image Simulation, Automatic Phase–Shifter Placement, and Subpeak Overlap Checking", SPIE, vol. 3096, pp. 163–172 (1997).

Schoenmaker, W., et al., "Theory and Implementation of a New Interpolation Method Based on Random Sampling", IMEC Technology Paper, pp. 1–35, Jan. 31, 1997.

Kubota, H., et al., "A Fast Method of Simulating Resist Pattern Contours Based on Mean Inhibitor Concentration", Jpn. J. Appl. Phys., vol. 37, pp. 5815–5820 (1998).

Fukuda, H., et al., "Determination of High–Order Lens Aberration Using Phase–Amplitude Linear Algebra", J. Vac. Sci. Technol. B, vol. 17, No. 6, pp. 3318–3321, Nov./Dec. 1999.

Balasinski, A., et al., "A Novel Approach to Simulate the Effect of Optical Proximity on MOSFET Parametric Yield", IEEE, pp. 37.6.1–37.6.4 (1999).

Balasinski, A., et al., "Comparison of Mask Writing Tools and Mask Simulations for 0.16um Devices", IEEE, SEMI Advanced Semiconductor Manufacturing Conference, pp. 372–377 (1999).

Adam, K., "Domain Decomposition Method For The Electromagnetic Simulation Of Scattering From Three–Dimensional Structures With Applications In Lithography", University of California Berkeley, College of Engineering, Electronics Research.

* cited by examiner

SIMULATION-BASED FEED FORWARD PROCESS CONTROL

BACKGROUND OF THE INVENTION

1. Field of the Invention

The invention relates to integrated circuits, and specifically to using simulation for feed forward process control during integrated circuit fabrication.

2. Discussion of the Related Art

A wafer fabrication company expends enormous resources to optimize its production processes for each technology node. A technology node refers to a set of processes that are based on a certain minimum feature size, i.e. critical dimension (CD), and requires the variance in that CD to be tightly controlled. For example, a wafer fabrication company may optimize its production process using 193 nm lithography technology with an acceptable line width variance of +/−20 nm. To optimize its production for each process, the wafer fabrication company uses a particular set of parameters for various pattern-defining processes during integrated circuit fabrication.

FIG. 1 illustrates a graph 100 plotting critical dimension (CD) values (x-axis) versus occurrences (y-axis) for a given process. The wafer fabrication company can develop a curve 101 based on a wide range of masks (or reticles in step-and-repeat projection systems, also referenced as masks herein; also as used herein the term stepper will refer to both stepper systems as well as step-and-repeat projection systems or scanners), wherein any mask having CD values between CD lower limit 102 and CD upper limit 103 would be considered an acceptable mask for that process. Of interest, each mask can demonstrate its own unique CD variation. For example, curves 104 and 105 represent CD variations for two different masks. Note that these CD variations are within CD lower limit 102 and CD upper limit 103. Therefore, the masks having these variations would be acceptable for the process(es) developed by the wafer fabrication company for that specific technology node.

Unfortunately, a process applicable to multiple masks can result in undesirable variations on the printed wafer and limits the ability to extract the optimal performance for a given mask. For example, assume that the two masks having the CD values represented by curves 104 and 105 are used to produce the same layer of an integrated circuit. In such a case, it would be desirable that curves 104 and 105 be identical to ensure that the printed wafers produced from such masks are as identical as possible. Moreover, even assuming these masks are for different layers or for different integrated circuits, it would be desirable for the process to minimize the range of CD values on each mask, thereby improving the functionality of that mask. Finally, as the features continue to be manufactured smaller, the effect of such mask CD variations on the printed wafer undesirably increases.

To minimize the effect of CD variations on a mask, users can currently print multiple wafers to determine the best lithographic and/or other pattern-defining parameters for that mask. However, this repetitive process is extremely time-consuming as the number of variables to consider is large and their interaction is complicated. Moreover, using the fabrication equipment and associated tools merely for optimizing parameters undesirably reduces the time that the equipment can be used for their intended function, i.e. to fabricate integrated circuits.

Therefore, a need arises for a method of automatically customizing a process for each mask to account for its unique CD variations.

SUMMARY OF THE INVENTION

The current complexity associated with wafer processing in the sub-wavelength environment requires tight control over all parameters within the process to achieve yielding devices at a reasonable cost. In accordance with one aspect of the invention, a method of providing information to downstream wafer fabrication processes allows each process to be customized based on the mask being used. The method comprises capturing an image of a mask, simulating a wafer image of the mask, generating a mask map of information based on the simulation, and providing the mask map to a downstream wafer fabrication process when such process involves the mask. Generating the mask map can include determining a critical dimension variance and/or an edge error variance for the mask. The downstream wafer fabrication process can include at least one of a lithographic process, a resist process, and an etch process.

Providing the mask map to the downstream wafer fabrication processes can include indicating a location of each element in the mask map. For example, in one embodiment, an identification code could be used on the mask to direct the downstream wafer fabrication process to that specific mask map. In another embodiment, providing the mask map to the downstream wafer fabrication process can include encoding a location of the mask map and allowing the downstream wafer fabrication process to decode the location. This encoding can include using a barcode, which could be located on the mask.

A method of optimizing a wafer fabrication process for a mask is also provided. The method comprises capturing an image of a mask and simulating a wafer image of the mask. A mask map of information can then be generated based on the simulation. This mask map can be provided to a downstream wafer fabrication process when such process involves the mask. In accordance with one aspect of the invention, at least one input parameter to the downstream wafer fabrication process can be changed based on the mask map.

The downstream wafer fabrication process can include a lithographic process, a resist process, and/or an etch process. If the downstream wafer fabrication process includes a lithographic process, then the parameter can include at least one of a type of illumination, a numerical aperture, a wavelength, a beam coherence, polarization mode, and an exposure dose. If the downstream wafer fabrication process includes a resist process, then the parameter can include at least one of a type of resist, a thickness of the resist, and a resist exposure. If the downstream wafer fabrication process includes an etch process, then the parameter can include at least one of a type of etching, a pressure, and an energy.

A system of providing information to downstream wafer fabrication processes is also provided. The system comprises means for capturing an image of a mask, means for simulating the image as it would appear on a wafer, means for generating a mask map of information based on the simulating, and means for providing the mask map to a downstream wafer fabrication process when such process involves the mask. The means for providing the mask map to the downstream wafer fabrication process can include means for indicating a location of each element in the mask map. In one embodiment, the means for providing the mask map to the downstream wafer fabrication process includes means for encoding a location of the mask map and means for allowing the downstream wafer fabrication process to decode the location. The means for generating the mask map can include means for determining a critical dimension variance on the mask and/or means for determining an edge error variance on the mask.

An input file to a wafer fabrication process is also provided. The input file includes simulation information regarding a mask used in the wafer fabrication process, wherein the simulation information customizes one or more input parameters to the wafer fabrication process. The simulation information can include at least one of a critical dimension variance and an edge error variance on the mask. In one embodiment, at least one of the critical dimension variance and the edge error variance can be represented as a histogram. In another embodiment, the simulation information can further include a simulated wafer image.

A computer program product can also be provided. This computer program product comprises a computer usable medium having a computer readable program code embodied therein for causing a computer to provide information to downstream wafer fabrication processes. The computer readable program code comprises computer readable program code that captures an image of a mask, computer readable program code that simulates a wafer image of the mask, computer readable program code that generates a mask map of information based on the wafer image, and computer readable program code that provides the mask map to a downstream wafer fabrication process when such process involves the mask.

A method of manufacturing an integrated circuit according to a first process designed for processing masks within a first specification using a first mask within the first specification is provided. The first process has at least one of a first set of lithographic parameters, a first set of resist parameters, and a first set of etch parameters. The method of manufacturing comprises generating a first mask map for the first mask using a computer system and a simulation performed using at least the first set of lithographic parameters. Using the first mask map, the method can determine whether the first set of lithographic parameters is acceptable. A second set of lithographic parameters and a second mask map responsive to the step of determining can be generated such that the second set of lithographic parameters is acceptable. Note that the second set of lithographic parameters is distinct from the first set of lithographic parameters. The first mask can be identified on a stepper. In accordance with one aspect of the invention, the stepper can be configured according to the second set of lithographic parameters, thereby exposing a wafer to electromagnetic radiation also according to the second set of lithographic parameters. In one embodiment, the step of identifying occurs prior to the steps of determining and generating. The first set of lithographic parameters can comprise the parameters of record for a given lithographic process. In another embodiment, the determining further comprises analyzing critical dimension variance against a predetermined tolerance for critical dimension variance for the lithographic process.

The method can further include generating the first mask map for the first mask using the computer system and the simulation performed using at least the first set of resist parameters. Using the first mask map, the method can determine whether the first set of resist parameters is acceptable. A second set of resist parameters can be generated, wherein the second mask map can be responsive to the step of determining such that the second set of resist parameters is acceptable. Note that the second set of resist parameters is distinct from the first set of resist parameters. The first mask can be identified on a resist tool, which in turn can be configured according to the second set of resist parameters. Depositing and/or exposing resist on the wafer can then be performed according to the second set of resist parameters.

The method can further include generating the first mask map for the first mask using the computer system and the simulation performed using at least the first set of etch parameters. Using the first mask map, the method can determine whether the first set of etch parameters is acceptable. A second set of etch parameters can be generated, wherein the second mask map is responsive to the step of determining such that the second set of etch parameters is acceptable. Note that the second set of etch parameters is distinct from the first set of etch parameters. The first mask can be identified on an etch tool. The etch tool can then be configured according to the second set of etch parameters. Finally, the wafer can be etched according to the second set of etch parameters.

DETAILED DESCRIPTION OF THE DRAWINGS

In accordance with one aspect of the invention, downstream processes can receive information regarding a specific mask. This information can advantageously customize such processes, thereby improving a wafer fabricated using that specific mask. Downstream processes could include, for example, a lithographic process, a resist process, an etching process, or any other process relating to wafer pattern definition.

Optimally, physical measurements (e.g. critical dimensions) of every point for every feature on the mask can be collected, thereby ensuring a complete snapshot of the mask. However, the time required to generate this information as well as providing a database to store this huge amount of information would be prohibitive. Moreover, with feature density significantly increasing over time, these time and storage needs will continue to be problematic.

Figure 2:
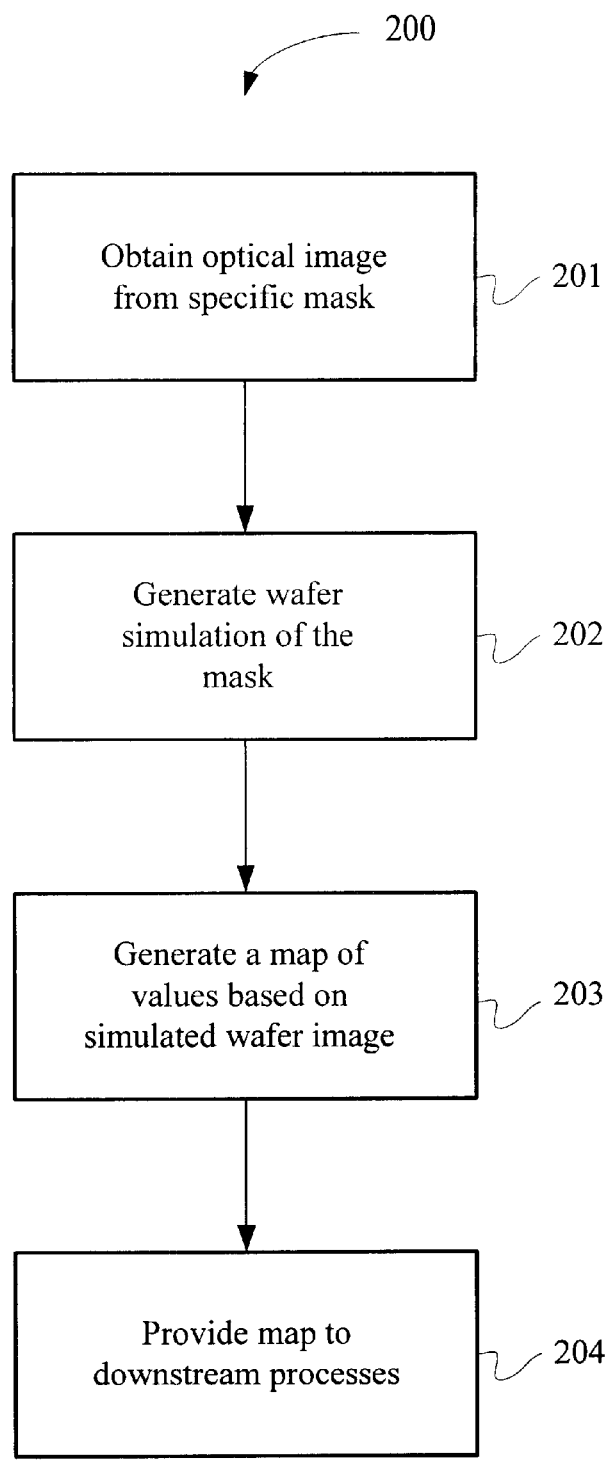
FIG. 2 illustrates a simplified flowchart of one embodiment for generating and using a mask map to improve downstream processes associated with wafer fabrication.

Therefore, in accordance with one aspect of the invention, data or metadata regarding simulated information can be stored in a map for each mask. FIG. 2 illustrates a simplified flowchart 200 of one embodiment for generating and using such a map. In this embodiment, an optical image can be obtained of a specific mask in step 201. In some embodiments, the image obtained in step 201 can be obtained using other measurement and observation equipment, e.g. a scanning electron microscope, etc. Using this optical image, a simulated wafer image can be generated in step 202. In step 203, a map of values based on the simulated wafer image can be generated. In step 204, this map can be provided to one or more downstream processes to customize those processes for the specific mask.

Figure 3:
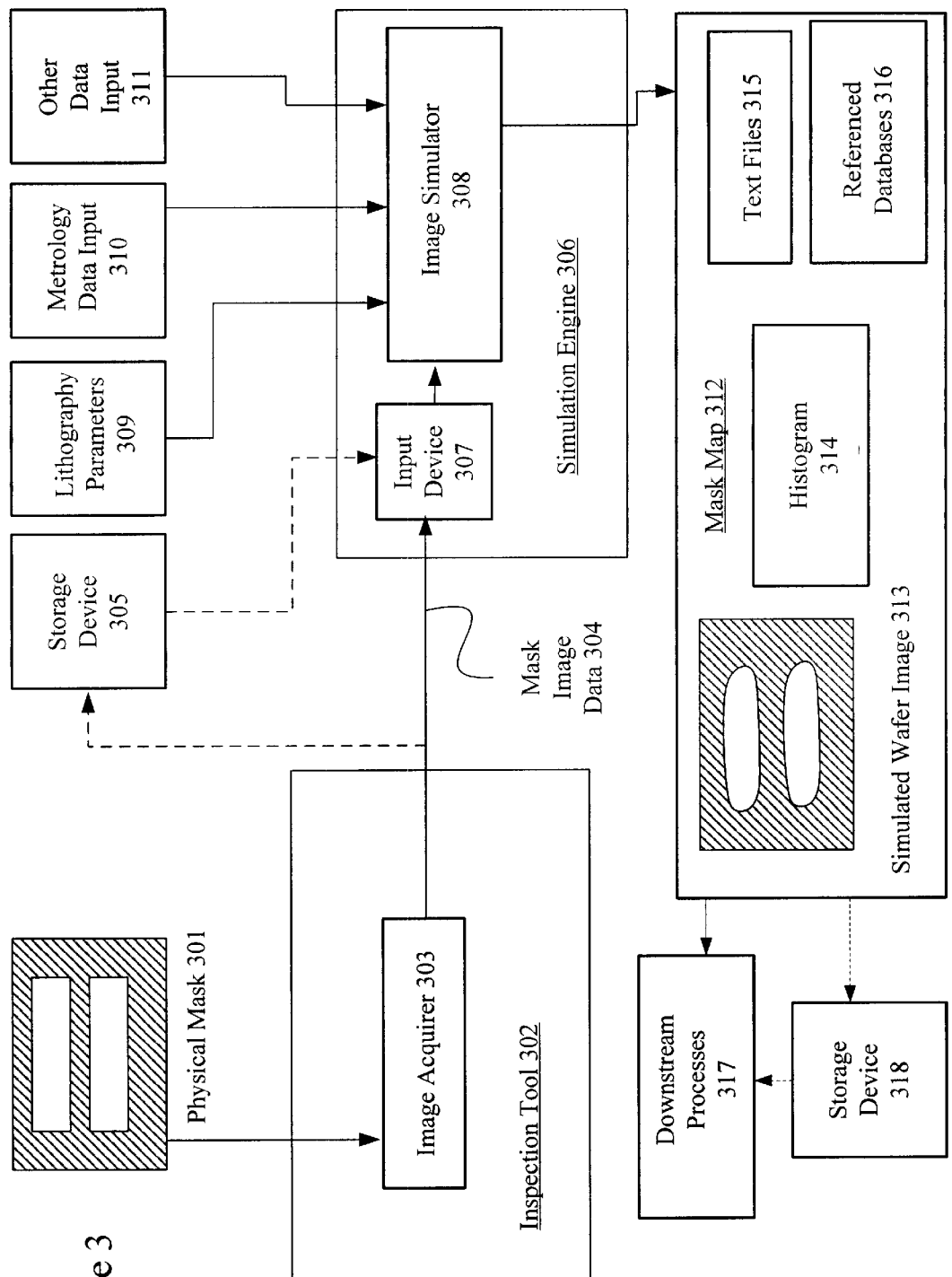
FIG. 3 illustrates a system for providing the process flow described in FIG. 2.

FIG. 3 illustrates a system for providing the process flow described in FIG. 2. In this system, an image acquirer 303 can capture an optical image of a physical mask 301. In one embodiment, image acquirer 303 can form part of an inspection tool 302.

Image acquirer 303 may comprise a high-resolution imaging device, such as a high resolution optical microscope, a scanning electron microscope (SEM), a focus ion beam, an atomic force microscope, or a near-field optical microscope, all of which are well known in the art of mask inspection. Image acquirer 303 may also comprise a device such as a CCD camera capable of interfacing with the particular type of microscope used and digitizing the image information from the microscope. For instance, a CCD camera that creates n-bit gray scale image data that is representative of the image from the microscope may be used.

Mask image data 304 provided by image acquirer 303 can be provided real-time to a simulation engine 306 or can be stored in a storage device 305 for off-line analysis. In one embodiment, mask image data 304 can be stored in a format such as Windows BMP in a computer hard disk drive, a CDROM, or a server. Note that image acquirer 303 can scan all or a portion of physical mask 301. In one embodiment, portions of physical mask 301 can be scanned and then stitched together to form a complete optical image of the mask.

Simulation engine 306 can include an input device 307 and an image simulator 308. Input device 307, in the case of stored image data from storage device 305, can include any hardware suitable for reading the type of media upon which the image data is stored. Thus, input device 307 could include a computer hard disk drive, a CDROM reader, or a personal computer attached to a server via a network, among others. In the case of a real-time feed of mask image data 304 from image acquirer 303, input device 307 may comprise a digitizing device, such as an image grabber. For example, in one embodiment, input device 307 can include an 8-bit frame grabber device, such as those that are known in the art including the Matrox™, Meteor™, and Pulsar™ tools.

Image simulator 308 receives its data from input device 307 and generates a unique mask map 312 for physical mask 301. In one embodiment, a tool implementing image simulator 308 may be run on a variety of computer platforms. These platforms may include: a PC using the Windows 2000™ or NT™ 4.0 operating system with 128 MB of RAM and a 200 MHz Pentium Pro™ microprocessor, either stand alone or connected to a network, and a SUN™ workstation computer among others. In one embodiment, the Virtual Stepper® System software, licensed by Numerical Technologies, Inc., can implement image simulator 308. Image simulator 308 can also receive other inputs, such as lithography parameters 309, metrology data input (e.g. phase or transmission information) 310, and other data input (e.g. resist, etch, and/or lens aberration parameters) 311. These inputs can include both standard settings as well as other specific settings to ensure that the CD tolerances of physical mask 301 are acceptable (see also FIG. 4).

In accordance with one feature of the invention, mask map 312 can include and/or reference any database including simulation information from physical mask 301. For example, mask map 312 could include a simulated wafer image 313 (e.g. in bit map form), a histogram 314, one or more text files 315, and/or any referenced databases 316 (e.g. a look-up table etc.). Thus, the elements of mask map 312 could be human-readable or computer-readable.

In one embodiment, an encoded identification, such as a barcode, on physical mask 301 can be used to identify mask map 312 or the various elements therein. In this embodiment, a downstream process 317 can include means for decoding this encoded identification. Mask map 312 can be located in one or more on- and/or off-chip locations to accommodate the simulation information regarding physical mask 301.

In accordance with one aspect of the invention, subsequent processes can read mask map 312, analyze the elements therein, and customize certain input parameters according to the elements of mask map 312. Specifically, the simulation information provided by mask map 312 can be used in any subsequent pattern-generating process, thereby allowing that process to be automatically customized based on a specific mask, e.g. physical mask 301.

For example, when the pattern on physical mask 301 is transferred to a resist on the wafer, the stepper used in the lithographic process can read the simulation information provided by mask map 312. Because mask map 312 is a "fingerprint", i.e. a unique identifier, of physical mask 310, the stepper can automatically customize its input parameters to optimize the pattern transfer from physical mask 301 to the wafer. The following stepper inputs (i.e. lithographic parameters) could be varied based on mask map 312:

the use of on-axis (e.g. annular) illumination versus off-axis (e.g. quadrapole) illumination;

the numerical aperture (NA);

the wavelength ($\lambda$);

the beam coherence ($\sigma$);

the exposure dose;

the lens aberrations;

the reduction factor;

the polarization mode; and/or other process parameters.

For example, lithographic parameters developed by one wafer fabrication facility for a technology node could include NA=0.6 and $\sigma$=0.7. However, by using mask map 312, the stepper could automatically determine that NA=0.61 and $\sigma$=0.76 is optimal for physical mask 301.

Of importance, simulation-based feed forward process control can apply to any phase of wafer fabrication. For example, a laser could initially generate radiation at a predetermined wavelength, e.g. 248 nm or 193 nm. However, over time, that same laser could lose uniformity or power, thereby affecting the dose provided to the wafer. This variance in radiation, in turn, can change the median CD value on the wafer from a given mask. Note that other pattern-generating parameters can also shift and/or increase CD variance. Moreover, any CD variance introduced by one parameter in one step/process can worsen the effect of the CD variance shift and/or increase introduced by another parameter in a following step/process. Thus, the ability to re-center the CD variance can advantageously minimize any adverse effect of a subsequent pattern-generating step/process on CD variance. Therefore, in this example, the actual illumination intensity of the to-be-used laser could be provided as another input to simulation engine 306 (e.g. as one of lithography parameters 309), wherein mask map 312 could include the appropriate exposure dose as one of referenced databases 316 when using that laser.

Other downstream pattern-defining parameters, such as resist parameters (e.g. type of resist, thickness of resist, and resist exposure level) and etch parameters (e.g. type of etching, pressure, energy, concentration, time, and temperature), can also be adjusted based on mask map 312. Note that mask map 312 could be provided to downstream processes 317 in real-time or could be stored in storage device 318 for future use. Storage device 318 could form part of or be separate from storage device 305.

Simulation-based feed forward process control can allow previously designated out-of-spec masks, which would otherwise be discarded, to be used in the pattern-generating processes. Specifically, any lithographic, resist, and etch parameters can now be adjusted based on mask map 312 to bring printed features on the wafer into specification. Thus, the simulation-based feed forward process control advantageously expands the number of usable masks.

Additionally, simulation-based feed forward process control allows for the production of substantially similar wafers using non-similar masks. Specifically, if various wafer fabrication facilities are required to produce wafers that are "identical", but are provided different or even out-of-spec masks, then prior art methods required rebuilding the masks until exact uniformity in wafer output was achieved. Advantageously, in accordance with one feature of the invention, the processes for each wafer fabrication facility can be uniquely changed to reflect its mask fingerprint (provided by mask map 312). In this manner, the wafers output for each wafer fabrication facility can be substantially identical, even if the masks used are not.

Note that optimizing pattern-generating processes could be limited to certain features on that mask. In other words, by using a tool that identifies critical features, such as the Critical Feature Module (CFM) tools licensed by Numerical Technologies, Inc., or by receiving user input regarding designated features, mask map 312 can include simulation information relating to a subset of the features on physical mask 301. In this manner, the user could minimize CD variance on certain features on the mask. In another embodiment, a tool could be used to specifically exclude features from analysis. For example, the CFM tool could be programmed to ignore "dummy" features (i.e. non-printing features that assist in the printing of adjacent features).

In yet another embodiment, optimizing pattern-generating processes could be limited to certain areas on a mask. Specifically, even on a single mask, the CD variations of one area can significantly differ from the CD variations of another area. This non-uniformity of CD variations can be caused by implementing different types of features (e.g. identified by pitch, density, and size) in different portions of the design (e.g. memory, logic, microprocessor, etc.). By using a tool that can identify areas or by receiving user input regarding designated areas, mask map 312 can include simulation information relating to such areas on physical mask 301. In this manner, the user could minimize the CD variance for certain areas on the mask.

Note that in one embodiment, image simulator 308 can interface with this feature/area identifier tool. Because this tool can identify a subset of the features/areas on physical mask 301, this tool can optimize computational resources by reducing simulation output, thereby saving valuable storage space and minimizing associated analysis of such simulation output during subsequent processes. Therefore, in one embodiment, mask map 312 can be addressable on a coordinate/region basis. In other words, a specific (x,y) coordinate or a specific region (e.g. rectangle, line, edge, polygon, etc.) can be associated with one or more simulation results. In another embodiment, mask map 312 can be addressable on a per defect basis, e.g. all regions with high CD variance, all low contrast regions, etc.

The embodiments described herein are illustrative only and not limiting. Note that although CD variations can provide one indication of a mask "fingerprint", other indications can also be used. For example, in another embodiment, the positions or placement of feature edges (i.e. edge error) on the mask can be used in lieu of CD variations. Further note that the simulation-based feed forward process control can also be applied to design data, i.e. layout information that has not been transferred to a mask.

The simulation of such information can also provide valuable information to downstream processes. For example, the SiVL® software licensed by Numerical Technologies, Inc. can receive design data to generate a simulation of the resulting wafer. However, because the design data does not include actual mask process-induced CD variations, the simulation results can vary from the simulation generated from an aerial image of an actual mask. Finally, actual results from any process can be used in combination with the simulation results to further improve the accuracy of the customization of subsequent processes. For example, after completion of a lithographic process, an actual wafer image could be simulated (i.e. substitute actual wafer image data for mask image data 304) for customizing downstream processes. In this manner, subsequent processes, such as etching, can benefit from any variations that could not be accounted for by the simulation of the mask image data.

Figure 4:
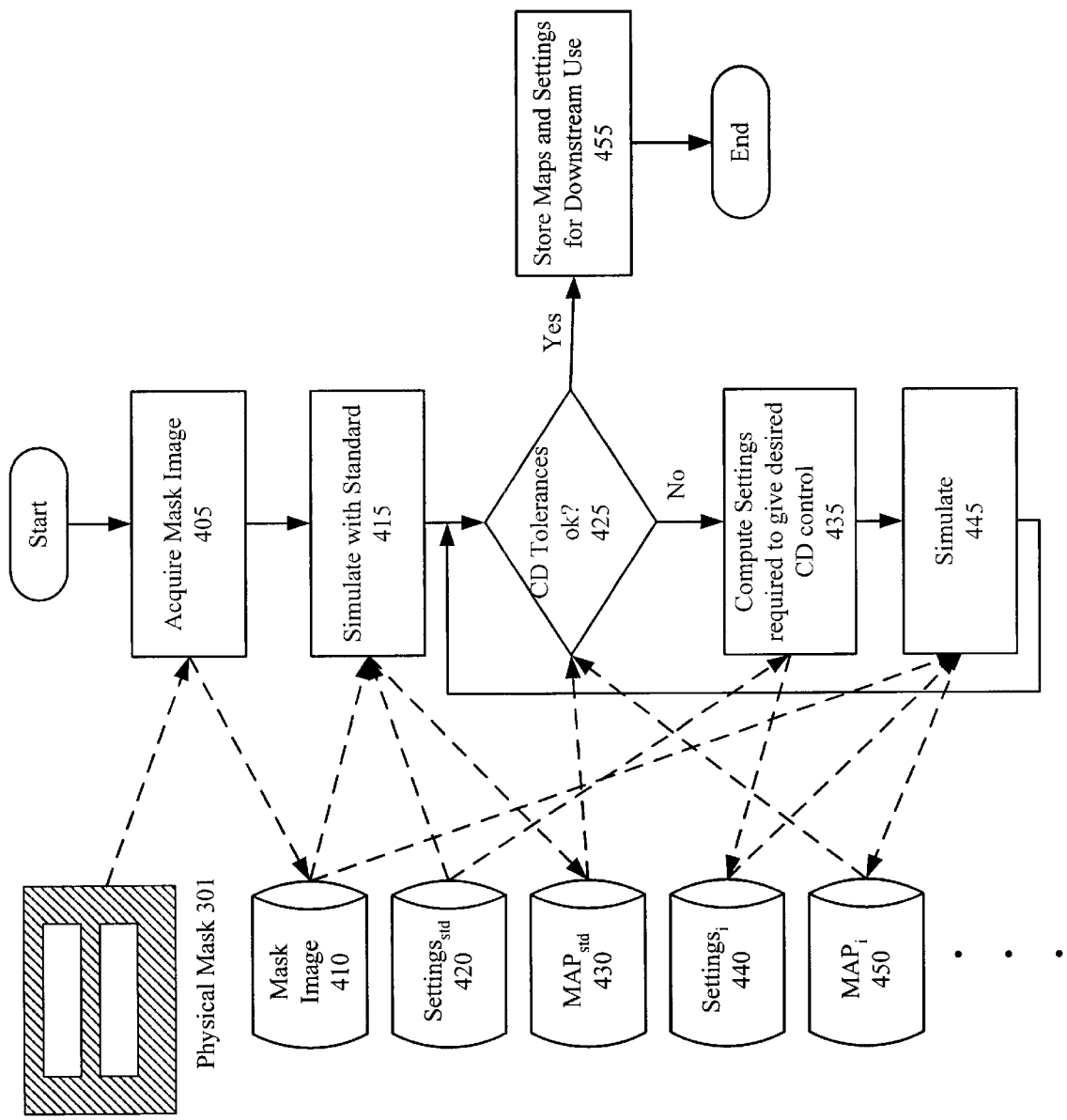
FIG. 4 illustrates the process flow for applying the systems and processes of FIGS. 2 and 3 to a specific mask in greater detail.

An example of a use of an embodiment of the invention may be helpful and will be considered in conjunction with FIG. 4.

Figure 1:
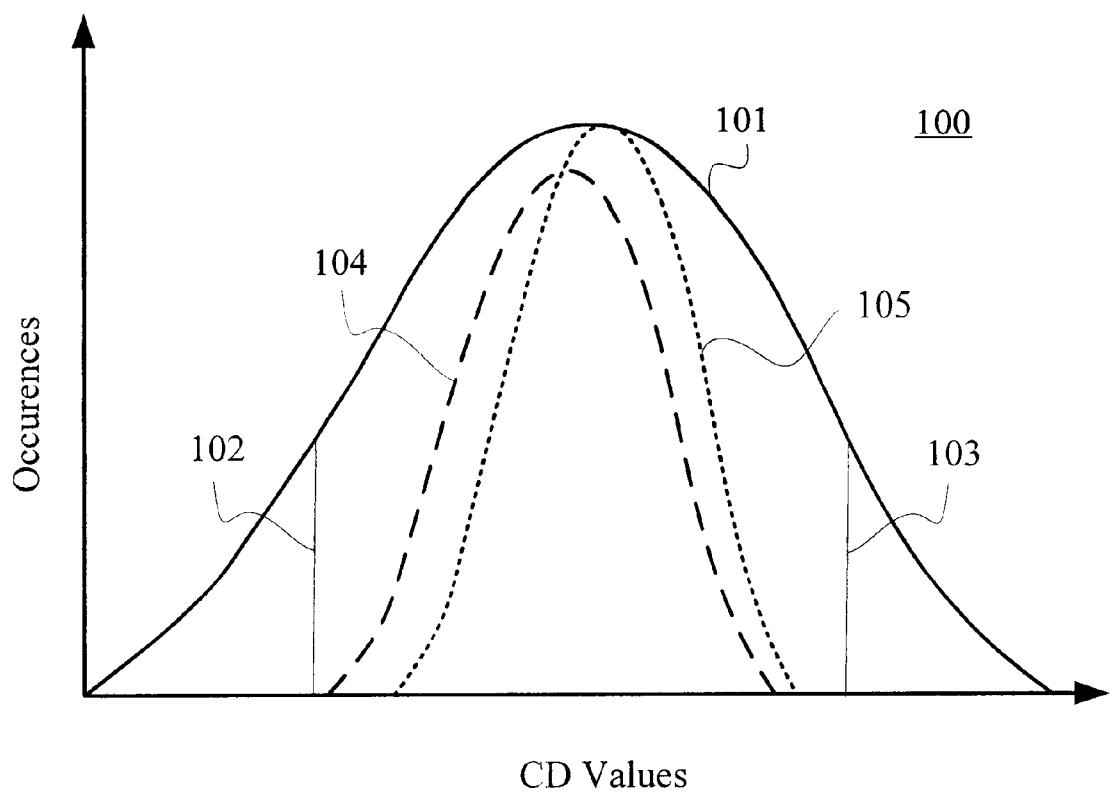
FIG. 1 illustrates a graph plotting critical dimension (CD) values (x-axis) versus occurrence (y-axis).

A given physical mask, e.g. physical mask 301, is to be used to produce a layer of material in an integrated circuit according to a particular wafer production process, e.g. the process described in connection with FIG. 1. Physical mask 301 therefore falls within the broad specification limits shown in FIG. 1, but without further processing it is unknown where physical mask 301 falls within the specification.

Physical mask 301 may be either on the upper or lower end of the specification limit (non-optimum), e.g. the curve may be centered close to upper limit 103 or lower limit 102. Accordingly, the processing for physical mask 301 can start at step 405 in FIG. 4 with the acquisition of a mask image 410. The acquisition of a mask image was described in greater detail in connection with FIG. 3. As noted, mask image 410 may be an optical, or other appropriate type of image for simulation based on the mask type and lithography process being used.

Next, at step 415, a simulation of mask image 410 of physical mask 301 can be performed using one or more standard settings 420. The resulting simulation output can then be assembled into a mask map with standard settings 430, which can be referred to as $MAP_{std}$. $MAP_{std}$ includes information related to how the features of physical mask 301 will print under the standard set of processing conditions (e.g. NA, $\lambda$, $\sigma$, illumination, resist type, etc.).

In some embodiments, the processing of FIG. 4 is now suspended until further downstream in the process, e.g. time of wafer printing at the wafer fabrication facility. In such embodiments, the mask map with standard settings 430 and mask image 410 should be accessible in one form or another for downstream use.

In this example, the process of FIG. 4 continues immediately upon generation of the mask map with standard settings 430 at step 425. Specifically, the CD tolerances of physical mask 301 are compared with the desired level of control for the process. If the CD tolerances are acceptable, the mask map and settings can be stored for downstream use at step 455. In some embodiments, the mask map directly includes the appropriate settings to use with the corresponding mask. In other embodiments, the mask map contains a reference to a location where the appropriate settings can be obtained.

If the CD tolerances are determined not to be acceptable at step 425, the process continues at step 435. At step 435, the settings required to give the desired CD control can be computed. This step can be a manual and/or automatic process. For example, in some embodiments, rules and/or a knowledge base can be used to adjust settings in response to an automated analysis of the $\text{MAP}_{std}$. In other embodiments, multiple simulations are carried out according to one or more predetermined processes to locate settings which after simulation (step 445) and checking of CD tolerances (step 425) are determined to be acceptable. In still other embodiments, a user is provided an interface to adjust settings and review simulation results until an acceptable result is reached. In still other embodiments, a combination of these processes may occur as part of step 435.

Continuing the example, if $\text{MAP}_{std}$ shows a large number of occurrences of "too small" features (e.g. close to the lower edge of the process of FIG. 1), then the settings may be altered at step 435 to lower the dose applied to the resist. Similarly, if the features of the given mask are found to be too large, then the dose can be raised. This computation and modification of the "process of record" settings at step 435 is designed to bring the CD tolerances into specification.

By way of example, other parameter changes that could occur at step 435 in response to a review of the $\text{MAP}_{std}$ include adjusting the focal position to control feature size. Many processes are created to work best at a particular focus, sometimes referred to as "best focus". However, through a combination of dose and focus modifications, mask feature sizes can be made smaller or larger on the wafer.

One way of determining best dose and focus position for a given mask is by actually taking the mask and placing it on the stepper and shooting a focus-exposure matrix. This is time consuming and must be done for each mask. However, as shown here, using the $\text{MAP}_{std}$ and mask image 410 the simulations can occur before physical mask 301 even reaches the wafer fabrication facility. Alternatively, in embodiments where the setting changes are computed when physical mask 301 is identified by the stepper or other wafer fabrication facility equipment, the setting changes are still computed without the need for creating a focus-exposure matrix.

Returning to the description of the process of FIG. 4, after the settings are computed at step 435 (either manually or automatically), the mask map can be recomputed with reference to mask image 410 and the newly computed settings 440. The resulting mask map 450 ($\text{MAP}_i$ where $\text{MAP}_1$ is the mask map with settings 1, $\text{MAP}_2$ with settings 2, etc.) is stored and then compared at step 425 for CD tolerances. If the CD tolerances are now acceptable, then the process continues at step 455. Otherwise, the process continues at steps 435 and 445 until a setting n is found such that $\text{MAP}_n$ produces acceptable CD tolerances. At step 455, the maps—and associated settings—can be stored for downstream usage.

Continuing the example, if physical mask 301 is sent to a wafer fabrication facility for use in production of integrated circuits, then when physical mask 301 is placed in the stepper, it can be identified and the appropriate mask map accessed. As noted, the appropriate settings for a given mask map can be stored with the mask map or referenced by the mask map. Additionally, the mask map may indicate whether step 425 has been performed, e.g. whether the CD tolerance was previously checked. If not, the process of FIG. 4 can resume at step 425 for physical mask 301 in the wafer fabrication facility by having the stepper linked and integrated to the appropriate database(s). If additional maps are available already, the one marked or flagged for use, e.g. as determined by step 425, can be accessed together with the appropriate settings for the lithography process.

Concluding the example, if there are a dozen physical masks throughout the world being used to produce the same layer of material for a given integrated circuit according to a process, each of those physical masks will have its own mask map and potentially different settings appropriate for use with that mask.

Note that the system and methods described herein can be applied to any lithographic process technology, including ultraviolet, deep ultraviolet (DUV), extreme ultraviolet (EUV), x-ray, and ebeam. Accordingly, it is intended that the scope of the simulation-based feed forward process control invention be defined by the following Claims and their equivalents.

What is claimed is:

1. A method of providing information to downstream wafer fabrication processes, the method comprising:

capturing an image of a mask;

simulating a wafer image of the mask;

generating a mask map of information based on the simulating; and providing the mask map to a downstream wafer fabrication process when such process involves the mask.

2. The method of claim 1, wherein the downstream wafer fabrication process includes at least one of a lithographic process, a resist process, and an etch process.

3. The method of claim 1, wherein providing the mask map to the downstream wafer fabrication process includes indicating a location of each element in the mask map.

4. The method of claim 1, wherein providing the mask map to the downstream wafer fabrication process includes encoding a location of the mask map and allowing the downstream wafer fabrication process to decode the location.

5. The method of claim 4, wherein encoding includes using a barcode.

6. The method of claim 1, wherein providing the mask map to the downstream wafer fabrication process includes using an identification code on the mask to direct the downstream wafer fabrication process to the mask map.

7. The method of claim 1, wherein generating the mask map includes determining a critical dimension variance for the mask.

8. The method of claim 1, wherein generating the mask map includes determining an edge error variance for the mask.

9. A method of optimizing a wafer fabrication process for a mask, the method comprising:

capturing an image of a mask;

simulating a wafer image of the mask;

generating a mask map of information based on the simulating;

providing the mask map to a downstream wafer fabrication process when such process involves the mask; and changing at least one input parameter to the downstream wafer fabrication process based on the mask map.

10. The method of claim 9, wherein the downstream wafer fabrication process includes at least one of a lithographic process, a resist process, and an etch process.

11. The method of claim 9, wherein if the downstream wafer fabrication process includes a lithographic process, then the parameter includes at least one of a type of illumination, a numerical aperture, a wavelength, a beam coherence, an exposure dose, lens aberration, reduction factor, and polarization mode.

12. The method of claim 9, wherein if the downstream wafer fabrication process includes a resist process, then the parameter includes at least one of a type of resist, a thickness of the resist, and a resist exposure level.

13. The method of claim 9, wherein if the downstream wafer fabrication process includes an etch process, then the parameter includes at least one of a type of etching, a pressure, an energy, concentration, time, and temperature.

14. The method of claim 9, wherein providing the mask to the downstream wafer fabrication process includes encoding a location of the mask map and allowing the downstream wafer fabrication process to decode the location.

15. The method of claim 9, wherein providing the mask to the downstream wafer fabrication process includes using an identification code on the mask to direct the downstream wafer fabrication process to the mask map.

* * * * *